US011275652B1

United States Patent
Danilov et al.

(10) Patent No.: US 11,275,652 B1
(45) Date of Patent: Mar. 15, 2022

(54) STORING ERASURE CODED DATA BASED ON RELIABILITY OF STORAGE DEVICES

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 17/008,709

(22) Filed: Sep. 1, 2020

(51) Int. Cl.
*G06F 11/00* (2006.01)
*G06F 11/10* (2006.01)
*H03M 13/15* (2006.01)

(52) U.S. Cl.
CPC ....... *G06F 11/1076* (2013.01); *H03M 13/154* (2013.01)

(58) Field of Classification Search
None
See application file for complete search history.

(56) References Cited

U.S. PATENT DOCUMENTS

| | | | | |
|---|---|---|---|---|
| 10,733,051 | B2* | 8/2020 | Dalmatov | G06F 3/0617 |
| 10,892,782 | B2* | 1/2021 | Danilov | G06F 11/1435 |
| 2011/0302477 | A1* | 12/2011 | Goss | G11C 16/0483 |
| | | | | 714/773 |
| 2012/0079318 | A1* | 3/2012 | Colgrove | G06F 3/0646 |
| | | | | 714/6.22 |
| 2014/0245109 | A1* | 8/2014 | Yim | G06F 11/1072 |
| | | | | 714/773 |
| 2015/0142752 | A1* | 5/2015 | Chennamsetty | G06F 16/113 |
| | | | | 707/665 |
| 2016/0041869 | A1* | 2/2016 | Davis | G06F 11/1012 |
| | | | | 714/773 |
| 2016/0062681 | A1* | 3/2016 | Samuels | G06F 3/0619 |
| | | | | 711/103 |
| 2016/0139981 | A1* | 5/2016 | Chennamsetty | G06F 11/108 |
| | | | | 714/773 |
| 2016/0232055 | A1* | 8/2016 | Vairavanathan | H03M 13/154 |

(Continued)

OTHER PUBLICATIONS

K. Peter, "Reliability Study of Coding Schemes for Wide-Area Distributed Storage Systems," 2011 19th International Euromicro Conference on Parallel, Distributed and Network-Based Processing, 2011, pp. 19-23, doi: 10.1109/PDP.2011.70. (Year: 2011).*

*Primary Examiner* — Daniel F. McMahon
(74) *Attorney, Agent, or Firm* — Amin, Turocy & Watson LLP

(57) ABSTRACT

The disclosed technology is generally directed towards selecting storage devices, based on predicted reliability, for storing erasure coded data fragments and coding fragments. In general, to increase data availability, data fragments, are stored to more reliable storage devices, while coding fragments are stored to less reliable storage devices. For example, solid state drives (SSDs) tend to fail based on the total number of writes they receive over time, whereby the total number of writes can be used to determine predicted reliability data for an SSD. Before writing the data and coding fragments to a number of storage devices, the storage devices can be sorted based on their predicted reliability such that the data fragments are written to (likely) more reliable devices and coding fragments to less likely storage devices.

20 Claims, 10 Drawing Sheets

(56) References Cited

U.S. PATENT DOCUMENTS

| | | | | |
|---|---|---|---|---|
| 2016/0378624 A1* | 12/2016 | Jenkins, Jr | ............ | H03M 13/13 |
| | | | | 714/6.3 |
| 2019/0179559 A1* | 6/2019 | Bolkhovitin | ........ | G06F 12/0253 |
| 2021/0057024 A1* | 2/2021 | Getreuer | ............ | G11C 16/3404 |
| 2021/0117104 A1* | 4/2021 | Nakao | ................... | G06F 3/0653 |

* cited by examiner

US 11,275,652 B1

STORING ERASURE CODED DATA BASED ON RELIABILITY OF STORAGE DEVICES

TECHNICAL FIELD

The subject application generally relates to storing data in data storage systems, and more particularly to a technology for storing erasure coded data fragments distributed among storage devices based on the reliability of the storage devices, and related embodiments.

BACKGROUND

Contemporary cloud-based data storage systems, such as ECS (formerly known as ELASTIC CLOUD STORAGE) provided by DELL EMC, can be based on a cluster of nodes that each owns some part of the stored data, including user data that is erasure coded for data protection purposes. In ECS, disk space is partitioned into a set of blocks referred to as chunks, which for example can be a fixed size of 128 MB. User data objects are stored in chunks, and a data object of typical size ordinarily comprises a set of segments stored to different chunks. The chunks can be shared, in that a chunk can contain segments of multiple, different user objects.

Chunk content is modified in append-only mode. When a chunk becomes full enough, the chunk gets sealed and can no longer be written to with further data. The content of a sealed chunk is immutable.

Erasure coding is used to protect user data at the chunk level. In general, erasure coded data fragments and coding fragments are written to a chunk space that is distributed among different storage devices, such as nodes, or different disks or solid state drives (SSDs) within a group of nodes. For example, the default scheme for ECS is 12+4, where k equals twelve data fragments and m equals four coding fragments. The way the erasure coding is done assures that the data storage system can tolerate the loss of any m fragments.

SSDs have different failure characteristics compared to hard drives, generally in that the more data writes to a given SSD, the more that SSD's failure probability increases. General purpose Redundant Arrays of Independent Disks (RAIDs) of SSDs take such failure characteristics into account, because parity blocks are updated more often than data blocks. However, erasure coding of immutable content does not consider such failure probability, because with immutable content, storage devices that store coding blocks do not receive more writes compared to storage devices that store data blocks.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
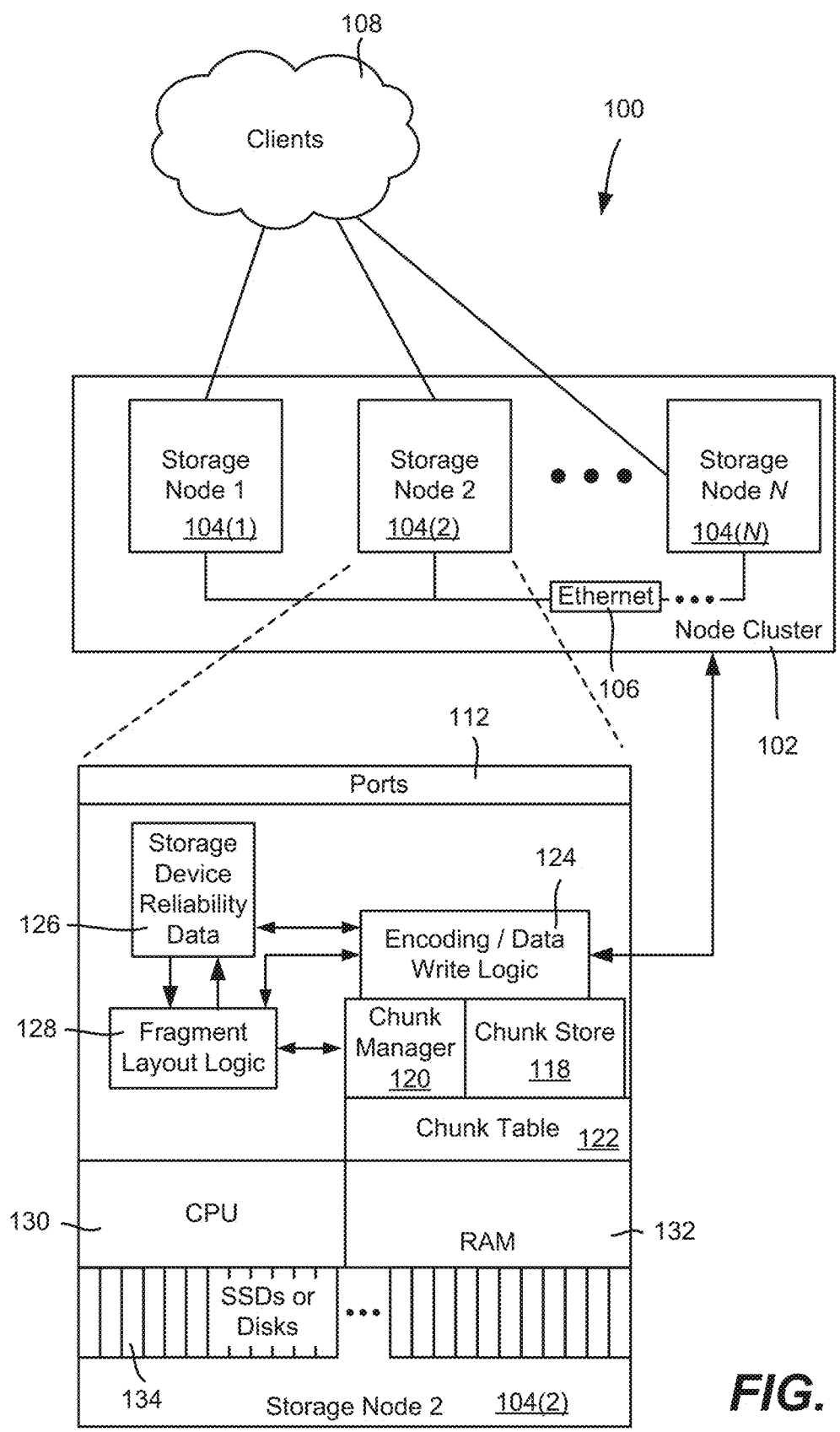
FIG. 1 is an example block diagram representation of part of a data storage system including nodes, including by which erasure coded data fragments and coding fragments can be distributed among the storage devices based on predicted reliability of the storage devices, in accordance with various aspects and implementations of the subject disclosure.

Various aspects of the technology described herein are generally directed towards using storage device failure probability information (e.g., disk age or number of writes to a solid state drive (SSD)) corresponding to predicted storage device reliability to improve data availability for storage systems that operate on immutable data portions. Rather than arbitrarily distributing data fragments and coding fragments to storage devices, based on reliability data, data fragments are written to storage devices deemed likely more reliable relative to storage devices to which coding fragments are written.

More particularly, as set forth above erasure coding assures that a data storage system can tolerate the loss of any m data and/or coding fragments; only if more than m data and/or coding fragments are lost is recovery not possible. From such a recovery perspective, data fragments and coding fragments are equal, and indeed recovery of data and coding fragments uses the same amount of system resources.

However, from a data storage perspective, data fragments and coding fragments are not equal, because the unavailability of coding fragment(s) does not impact the availability of user data. In contrast, the unavailability of data fragment (s) means user data is unavailable from the moment the data fragment(s) are lost until recovery is complete. Therefore, it is preferable to lose coding fragments.

Further, when a chunk is unrecoverable, there is data loss because at least one data fragment is lost. However, the number of lost data fragments can be significant, particularly when chunks (data portions) are shared. In such a situation, the number of objects impacted directly depends on the number of data fragments lost. Ideally, the set of lost fragments would contain the m coding fragments and a minimal number of data fragments.

Thus, when storing data fragments and coding fragments to a set of storage devices having different reliability characteristics, it can be statistically beneficial to store the data fragments to more reliable storage devices and the coding fragments to less reliable storage devices. In the example of an SSD whose reliability decreases as the SSD receives more writes, the data fragments can be stored to less worn (likely more reliable) SSDs and the coding fragments can be stored to more worn (likely less reliable SSDs). This corresponds to a decreased probability of a lost fragment being a data fragment and an increased probability of that lost fragment being a coding fragment. As a result, data unavailability events that necessitate a data recovery operation occur less often. Further, although such a reliability-configured distribution of data fragments and coding fragments does not reduce the probability of data loss events, if a data loss does occur, the number of impacted user data objects generally is decreased.

As will be understood, the implementation(s) described herein are non-limiting examples, and variations to the technology can be implemented. For instance, many of the examples herein are based on ECS, however the technology is applicable to any data storage system that has units of data that need to be protected. As another example, although the term "chunk" is used herein to represent any data storage unit or data portion, the term "chunk" is not limited to ECS chunks, but rather represents any data storage unit, such as corresponding to the fragment level or the stripe level in other storage systems. Further, while the technology provides benefits with storage devices including SSDs and hard disks, data storage of data and coding fragments on any storage device types including those not yet developed can benefit from the technology described herein as long as their predicted reliability can be determined. As such, any of the embodiments, aspects, concepts, structures, functionalities, implementations and/or examples described herein are non-limiting, and the technology may be used in various ways that provide benefits and advantages in data storage in general.

Reference throughout this specification to "one embodiment," "an embodiment," "one implementation," "an implementation," etc. means that a particular feature, structure, or characteristic described in connection with the embodiment/implementation is included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations.

Aspects of the subject disclosure will now be described more fully hereinafter with reference to the accompanying drawings in which example components and operations are shown. In the following description, for purposes of explanation, numerous specific details are set forth in order to provide a thorough understanding of the various embodiments. However, the subject disclosure may be embodied in many different forms and should not be construed as limited to the examples set forth herein.

FIG. 1 shows part of a data storage system 100 (such as ECS) comprising a node cluster 102 of storage nodes 104(1)-104(N), in which each node is typically a server configured primarily to serve objects in response to client requests. The nodes 104(1)-104(N) are coupled to each other via a suitable data communications link comprising interfaces and protocols, such as represented in FIG. 1 by Ethernet block 106.

Clients 108 make data system-related requests to the cluster 102, which in general is configured as one large object namespace; there may be on the order of billions of objects maintained in a cluster, for example. To this end, a node such as the node 104(2) (shown enlarged in FIG. 1 as well) generally comprises ports 112 by which clients connect to the cloud storage system. Example ports are provided for requests via various protocols, including but not limited to SMB (server message block), FTP (file transfer protocol), HTTP/HTTPS (hypertext transfer protocol) and NFS (Network File System); further, SSH (secure shell) allows administration-related requests, for example.

Each node, such as the node 104(2), includes an instance of a data storage system; (note however that at least some data service components can be per-cluster, rather than per-node, or possibly per-subgroup of nodes). For example, ECS runs a set of storage services, which together implement storage logic. Services can maintain directory tables for keeping their metadata, which can be implemented as search trees. A blob service maintains an object table (e.g., in various partitions among nodes) that keeps track of objects in the data storage system and generally stores their metadata, including an object's data location information, e.g., chunk identifier (ID) and offset location within a chunk. There is also a "reverse" directory table (maintained by another service) that keeps a per chunk list of objects that have their data in a particular chunk.

FIG. 1 further represents some additional concepts, in that the user data repository of chunks is maintained in a chunk store 118, managed by another storage service referred to as a chunk manager 120. A chunk table 122 maintains metadata about chunks, e.g., as managed by the chunk manager 120. Chunks of user data are protected by erasure coding, forming protection groups; (other types of chunks can be protected in other ways, such as by replication).

As described herein, encoding and data write logic 124 operates to distribute data in data fragments and coding fragments across different storage devices of the node cluster 102. To this end, for erasure coded data, the chunk is distributed among multiple nodes/storage devices as described herein. As part of this distribution, storage device reliability data 126 is obtained, and used by fragment layout logic 128 to determine which storage devices are to be used for storing a distributed chunk's data fragments and which are to be used for storing coding fragments.

In FIG. 1, a CPU 130 and RAM 132 are shown for completeness; note that the RAM 130 may comprise at least some non-volatile RAM. The node 104(2) further includes storage devices such as disks 134, comprising hard disk drives and/or solid-state drives, or any other suitable type of storage resource. As can be readily appreciated, components of the data storage system including those described herein can be at various times in any storage device or devices, such as in the RAM 132, in the SSDs and/or disks 134, or in a combination of both, for example.

In general, in ECS implementations, disk space is partitioned into a set of blocks of fixed size called chunks, which in one or more implementations are 128 MB in size. The various types of data, including user data and various types of metadata, are stored in chunks. There are different types of chunks, one type per capacity user. In particular, user data is stored in repository chunks, and chunks can be shared. For instance, one chunk may (and in typical cases does) contain segments of multiple user objects. As described herein, a user data chunk can be distributed among the nodes/storage devices of the node cluster in large data fragments (relative to smaller object data fragments) and large coding fragments, corresponding to erasure coding, so that the data fragments and coding fragments of the chunk are protected against node or storage device failure.

One implementation of ECS uses matrix-based erasure coding, in which k+m data and coding fragments are a matrix-vector product, where the vector comprises k data fragments. The matrix is a Distribution Matrix of (k+m)×k size. The first k rows of the distribution matrix compile a k×k identity matrix. The bottom m rows of the distributed matrix are referred to as the Coding Matrix. Coefficients $X_{i,j}$ can be defined in a variety of ways depending on erasure coding algorithm used.

Figure 2:
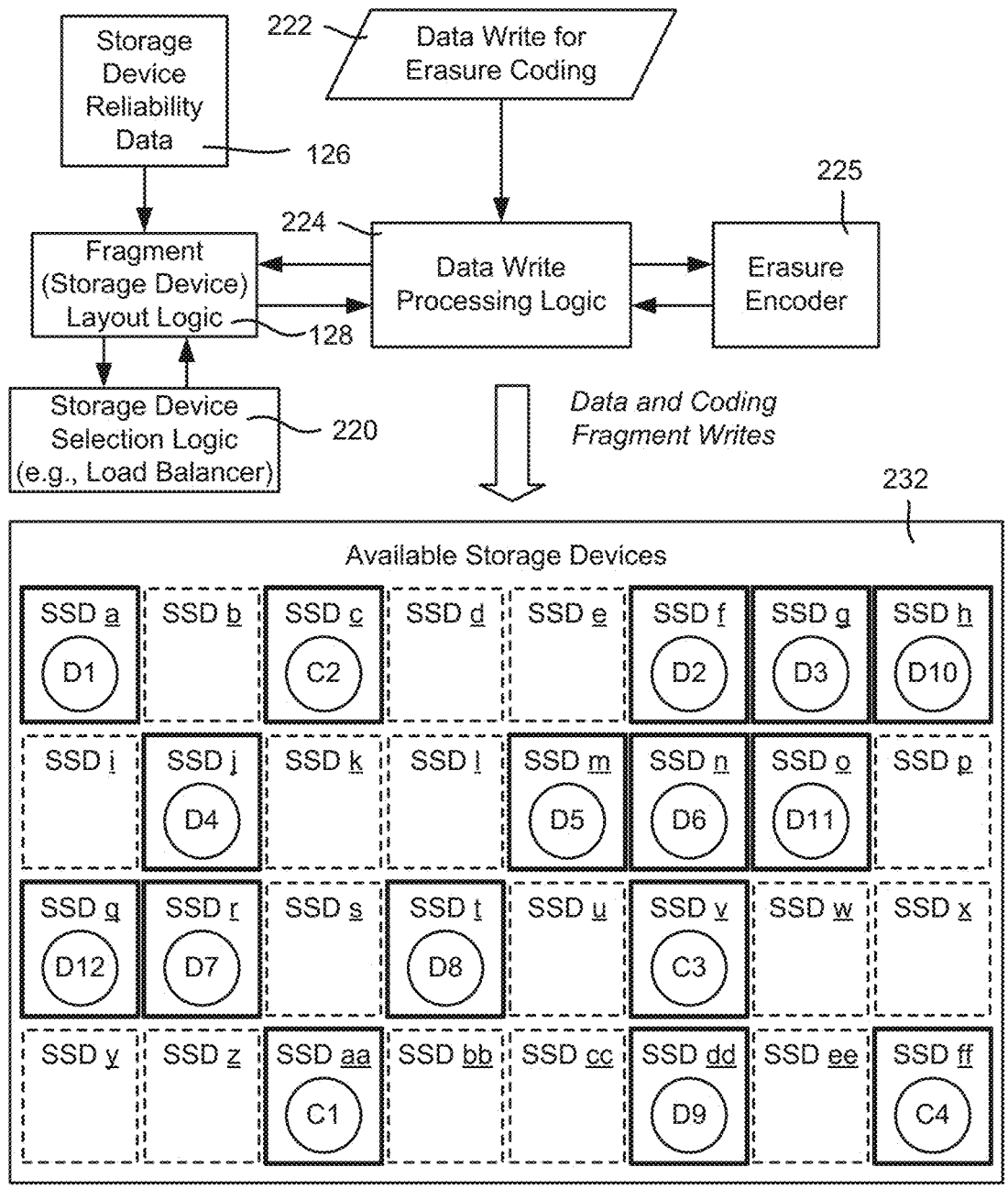
FIG. 2 is an example representation of available storage devices showing how data fragments and coding fragments can be distributed among selected storage devices based on the storage devices' predicted reliability data, in accordance with various aspects and implementations of the subject disclosure.

Turning to FIG. 2, for user data, repository chunks have a specific data layout comprising the data fragments and coding fragments distributed among data storage nodes/storage devices. As set forth above, in one or more ECS implementations the default encoding scheme for is 12+4, that is, k equals to 12 and m equals to 4. This 12+4 protection scheme is used in the following examples, in which there are 16 total fragments to be stored on 16 of 32 available SSDs (SSD a-SSD ff). It is understood, however, that the technology described herein is applicable to different k+m encoding schemes and to clusters having different numbers of nodes and/or nodes having different numbers of storage devices.

FIG. 2 shows one possible data layout, in which there are (at least) 16 SSDs for the 16 data and coding fragments to be stored, with the SSDs configured on one or more nodes of the data storage system. Each SSD contains only one fragment.

Figure 3:
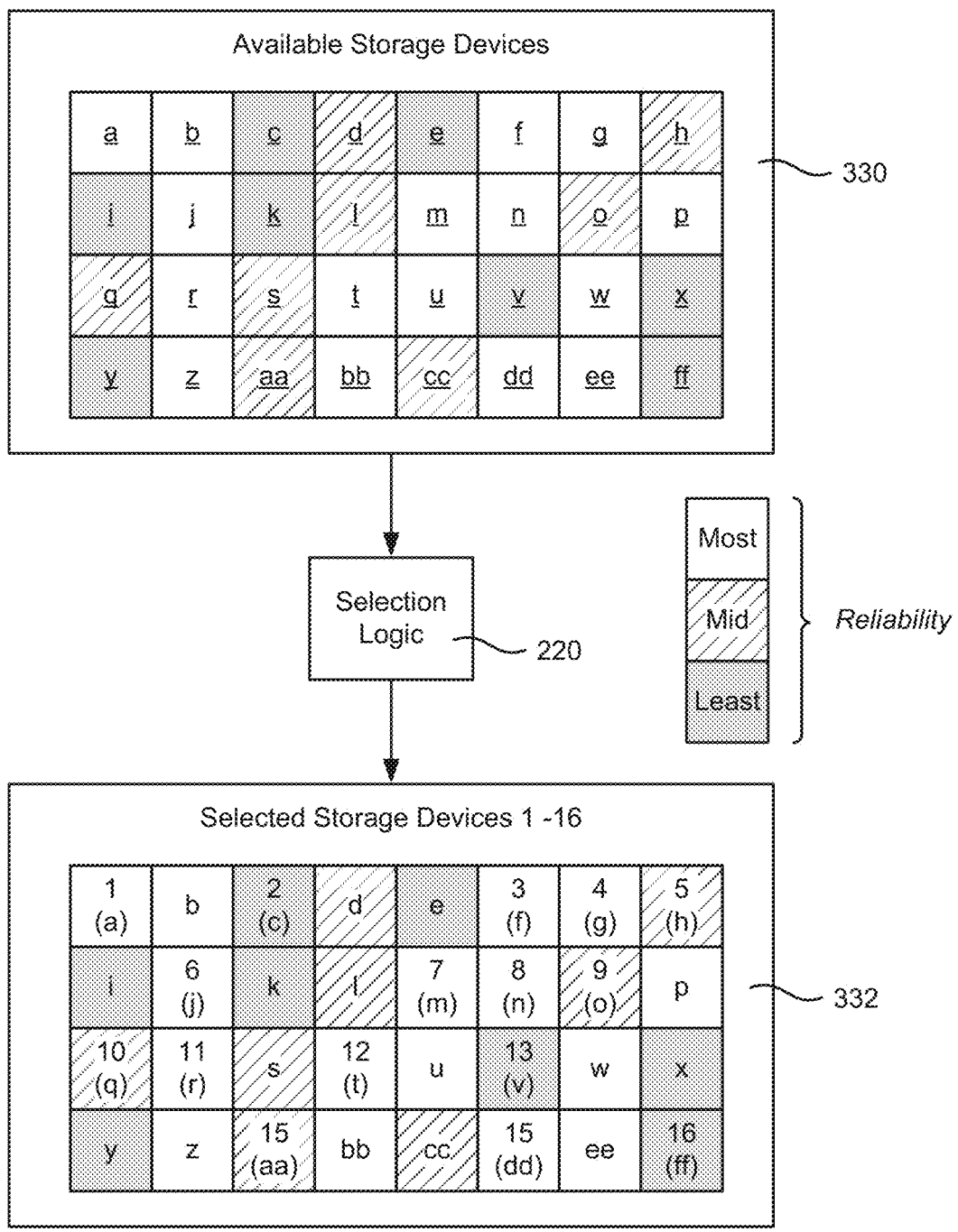
FIG. 3 is an example representation of selected storage devices with data fragments and coding fragments stored according to the storage devices' predicted reliability data, in accordance with various aspects and implementations of the subject disclosure.
Figure 4:
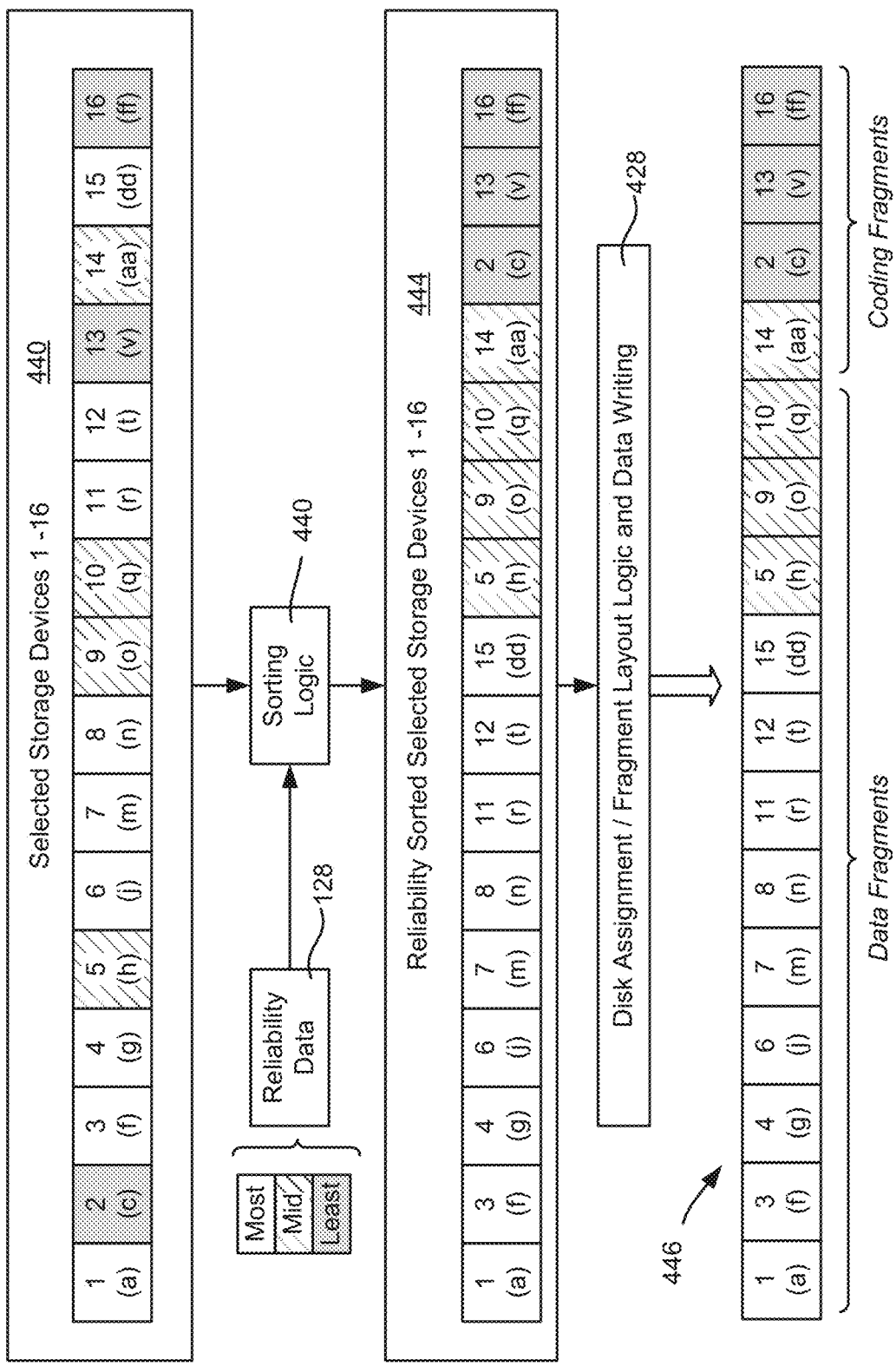
FIG. 4 is an example representation of how selected storage devices can be sorted by the storage devices' predicted reliability data, and used for storing data fragments and coding fragments, in accordance with various aspects and implementations of the subject disclosure.

In general, when a distributed chunk's space is to be allocated, such as when a data write 222 for erasure coding needs a new distributed chunk, storage device selection logic 220 (such as based on load balancing) provides the fragment layout logic 128 with a set of storage devices to use for the chunk space. In the example of FIGS. 2-4, consider that of the 32 available SSDs (SSD a-SSD ff) shown in block 232, the 16 selected storage devices are SSD a, SSD c, SSD f, SSD g, SSD h, SSD j, SSD m, SSD n SSD o, SSD q, SSD r, SSD t, SSD v, SSD aa, SSD dd and SSD ff. The 16 data fragments and coding fragments are to be written to these 16 SSDs, but instead of being arbitrarily written, the data fragments and coding are written based on the storage device reliability data 116.

To this end, before the data write processing logic 224 in conjunction with the erasure encoder 225 writes the data fragments and coding fragments, the fragment (storage device) layout logic 128 works with the data write processing logic 224 to determine which of the SSDs are to be used for data fragments and which are to be used for coding fragments, based on the reliability data 126. This is further explained with reference to FIGS. 3 and 4.

FIG. 3 shows additional details of the above example, in which for simplicity of explanation the available SSDs (block 330) are divided into three groups, such as most likely reliable (unshaded), medium likely reliable (lightly shaded/hashed) and least likely reliable (shaded). This can be determined on the number of writes to each SSD, which can be determined in various straightforward ways, including via tracking (e.g., via an application and/or operating system component), querying and so forth. For hard disk drives, groups can include almost new, middle age, and rather old, on the basis that age is useful in predicting disk failure. In general, the selection logic 220 has no idea of a storage device's likely reliability, although it is feasible to have selection logic 220 that has some knowledge of reliability, and/or that can interact with the fragment (storage device) layout logic 128 to select at least some different storage devices if, for example, the selection logic 220 selects more than four "least" reliable storage devices.

FIG. 4 shows the sixteen selected storage devices (numbered and ordered 1-16) in block 440 along with their respective storage device identifiers, e.g., selected storage device 1 maps to SSD a, selected storage device 2 maps to SSD c, and so on. Note that FIG. 4 continues to use the scheme of FIG. 3 to differentiate the three groups, that is, most likely reliable (unshaded), medium likely reliable (lightly shaded/hashed) and least likely reliable (shaded).

In one aspect, sorting logic 442 sorts the selected storage devices based on the reliability data, resulting in reliability-sorted selected storage devices (block 444). This can be a sort based on actual number of SSD writes (or disk age), for example, or can be a done by grouping into most likely reliable, medium likely reliable and least likely reliable. If grouping is used, any other grouping can be used, e.g., there can be four groups, five groups and so on.

Once sorted, the fragment layout logic performs disk assignment, which the data writing logic uses to perform the writes, as generally represented in FIG. 4 via block 428. As can be seen, data fragments are thus written to the SSDs sorted from highest likely reliability to medium likely reliability, and coding fragments from medium likely reliability to lowest likely reliability. The post-writing layout of the sixteen (12+4) fragments among the full set of available storage devices can be seen in block 232 of FIG. 2 and block 332 (with shading) of FIG. 3.

Figure 5:
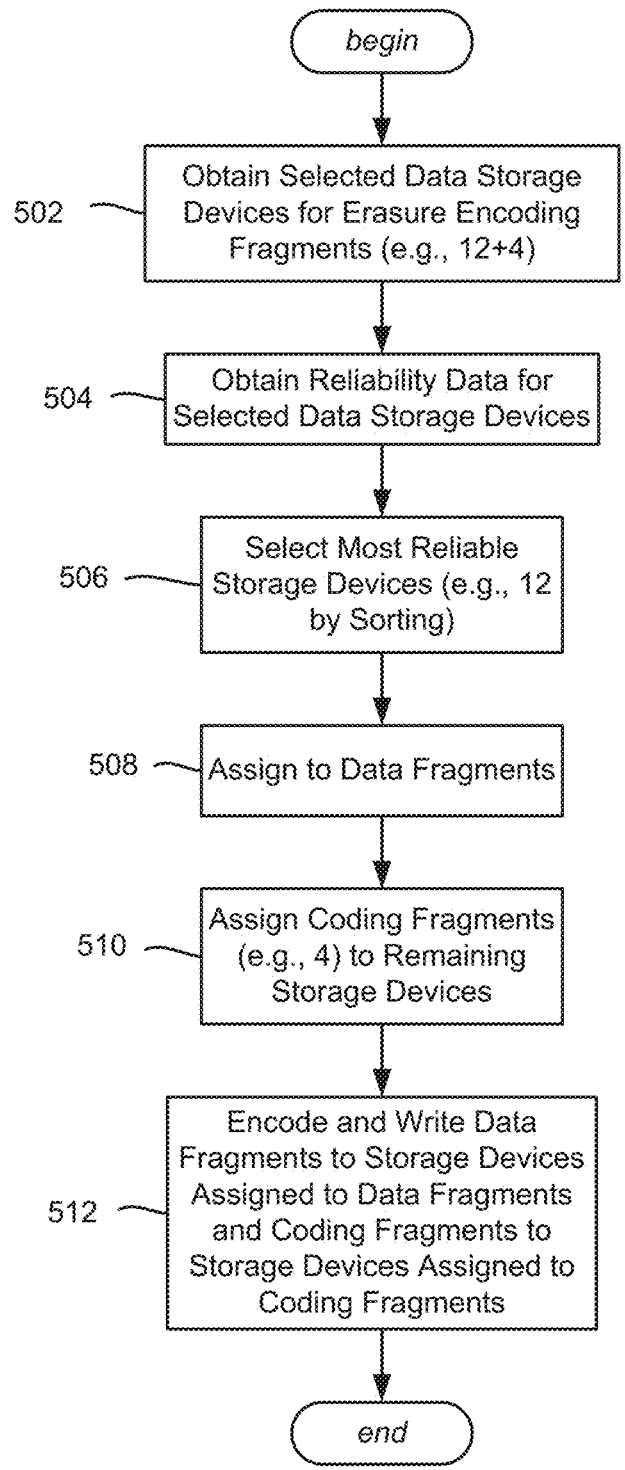
FIG. 5 is a flow diagram representation of example operations related to storing data fragments and coding fragments to distributed storage devices based on the various devices' predicated reliabilities, in accordance with various aspects and implementations of the subject disclosure.

FIG. 5 is a flow diagram summarizing example operations generally described herein. When there is a request to allocate capacity for a chunk to be protected via erasure coding, e.g., for sixteen data and coding fragments, operation 502 obtains the set of selected storage devices. Note that this can be obtained from existing load balancing device(s).

Operation 504 represents obtaining (e.g., accessing) the reliability data for each of the selected storage devices. At operation 506, the selected storage devices are sorted by reliability (e.g., age, weariness such as writes and so on, depending on the type of storage device).

Once sorted, the most reliable storage devices are selected and assigned to data fragments at operation 508. That is, the data storage system assigns the first twelve (more likely reliable) storage devices to store the twelve data fragments. At operation 510, the remaining (less likely reliable) four disks are assigned to store the four coding fragments in this example.

Note that although not explicitly shown herein, it is feasible for the data storage system to request different storage devices before sorting. For example, if the selection logic returned five very worn SSDs in the set of sixteen, the data storage system can request a newer SSD. It is also feasible for the data storage system to request allocation of more storage devices than needed, then sort and deallocate unneeded ones to obtain a desired reliability combination, although eventually this might adversely impact load balancing without additional processing.

In this way, less reliable storage devices tend to be occupied by coding fragments, with data fragments tending stored to more reliable new and middle-aged disks. Note that for example, without use of the technology described herein the second data fragment might have been be stored to the less reliable storage unit (e.g., SSD 2 in block 440 of FIG. 4).

Figure 6:
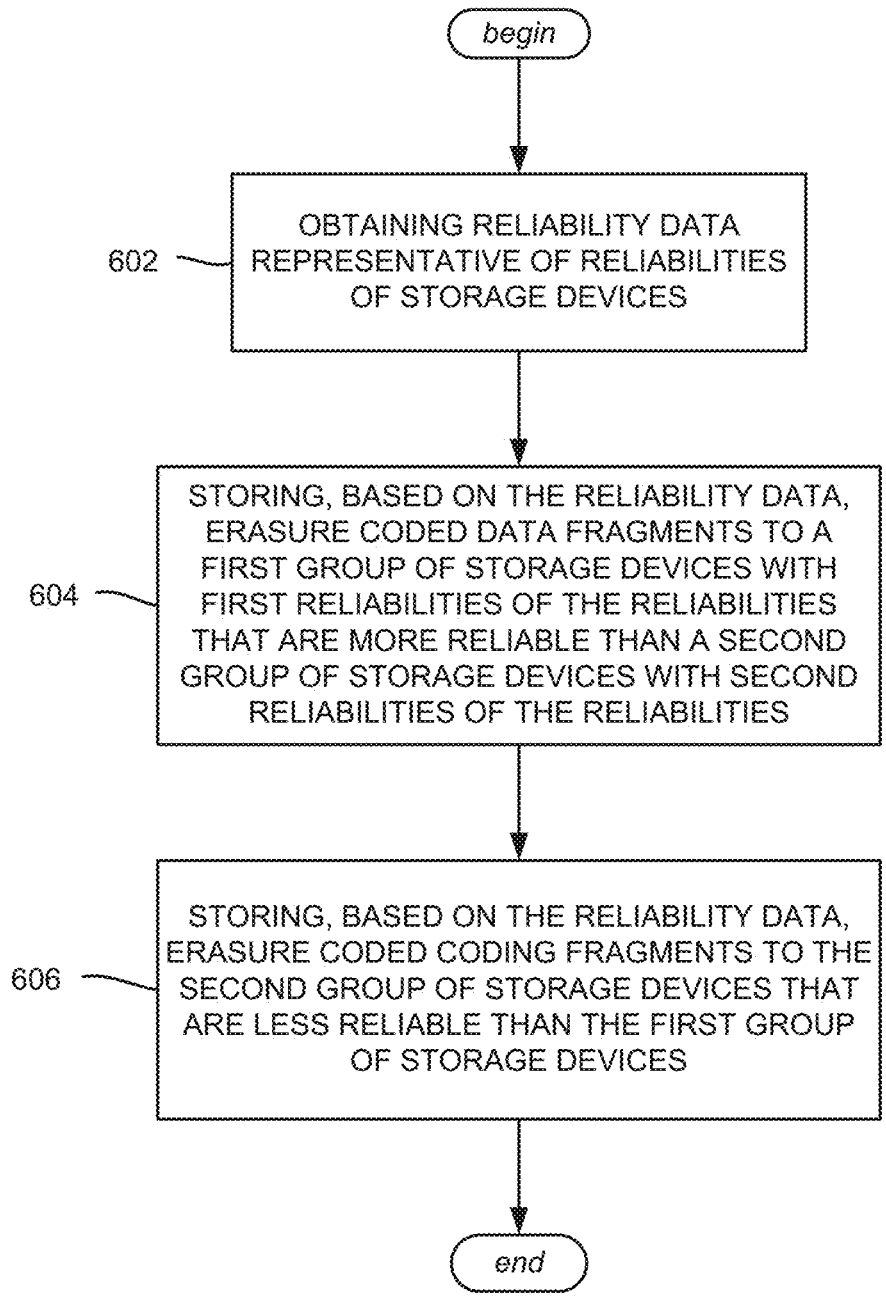
FIG. 6 is a flow diagram representation of example operations related to using reliability data of storage devices to determine how to store distributed data fragments and coding fragments, in accordance with various aspects and implementations of the subject disclosure.

One or more aspects are represented in FIG. 6, and for example can be a system, comprising a processor, and a memory that stores executable instructions that, when executed by the processor, facilitate performance of operations. Example operations can comprise operation 602, which represents obtaining reliability data representative of reliabilities of storage devices. Operation 604 represents storing, based on the reliability data, erasure coded data fragments to a first group of storage devices with first reliabilities of the reliabilities that are more reliable than a second group of storage devices with second reliabilities of the reliabilities. Operation 606 represents storing, based on the reliability data, erasure coded coding fragments to the second group of storage devices that are less reliable than the first group of storage devices.

Determining the reliability data can comprise determining values representing respective numbers of data writes to the storage devices. The storage devices can comprise solid state drives. The storage devices can comprise a redundant array of solid state drives.

Determining the reliability data comprises determining respective ages of the storage devices. The storage devices can comprise hard disk drives.

Further operations can comprise erasure coding a chunk data structure into the erasure coded data fragments and the erasure coded coding fragments.

Further operations can comprise selecting the storage devices as a group, and sorting the group based on the reliability data.

Further operations can comprise dividing the storage devices into subgroups based on the reliability data, and selecting one or more first subgroups of the subgroups that are more reliable for storing the erasure coded data fragments according to first reliabilities of the reliabilities, and selecting one or more second subgroups of the subgroups that are less reliable for storing the erasure coded coding fragments according to second reliabilities of the reliabilities.

Further operations can comprise dividing, based on the reliability data, the storage devices into a higher reliable subgroup according to first reliabilities of the reliabilities, a medium reliable subgroup according to second reliabilities of the reliabilities, and a lower reliable subgroup according to third reliabilities of the reliabilities; storing the erasure coded data fragments to the first group of storage devices can comprise storing the erasure coded data fragments to the higher reliable subgroup and to a first part of the medium reliable subgroup storing the erasure coded coding fragments to the second group of storage devices can comprise storing the erasure coded data fragments to a second part of the medium reliable subgroup and to the lower reliable subgroup.

Further operations can comprise pre-allocating a distributed chunk data structure on the storage devices, comprising allocating data fragment space of the distributed chunk data structure on the first group of storage devices, and allocating coding fragment space of the distributed chunk data structure on the second group of storage devices.

Figure 7:
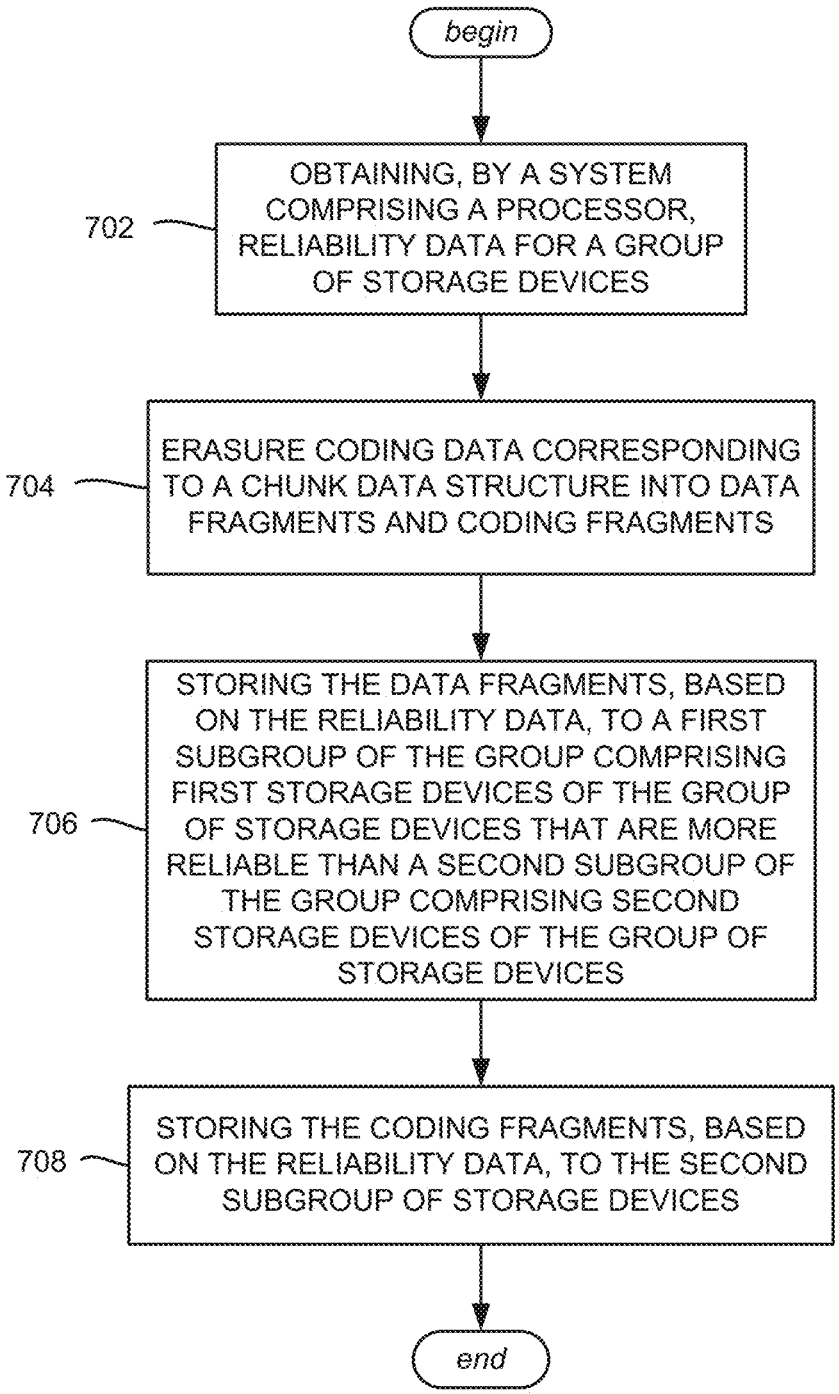
FIG. 7 is a flow diagram representation of example operations related to storing erasure coded data fragments and coding fragments based on predicted reliability of the storage devices, in accordance with various aspects and implementations of the subject disclosure.

One or more example aspects are represented in FIG. 7, and can correspond to operations of a method, for example. Example operations comprise operation 702, which represents obtaining, by a system comprising a processor, reliability data for a group of storage devices. Operation 704 represents erasure coding data corresponding to a chunk data structure into data fragments and coding fragments. Operation 704 represents storing the data fragments, based on the reliability data, to a first subgroup of the group comprising first storage devices of the group of storage devices that are more reliable than a second subgroup of the group comprising second storage devices of the group of storage devices. Operation 708 represent storing the coding fragments, based on the reliability data, to the second subgroup of storage devices.

The group of storage devices can comprise solid state devices, and obtaining the reliability data for the group of storage devices can comprise tracking respective data writes to respective solid state devices.

The group of storage devices can comprise disk drives, and obtaining the reliability data for the group of storage devices can comprise obtaining respective ages of the disk drives.

Aspects can comprise sorting the group of storage devices based on the reliability data to determine the first subgroup and the second subgroup.

Aspects can comprise dividing the group of storage devices based on the reliability data into higher reliability, medium reliability and lower reliability subsets to determine the first subgroup and the second subgroup.

Figure 8:
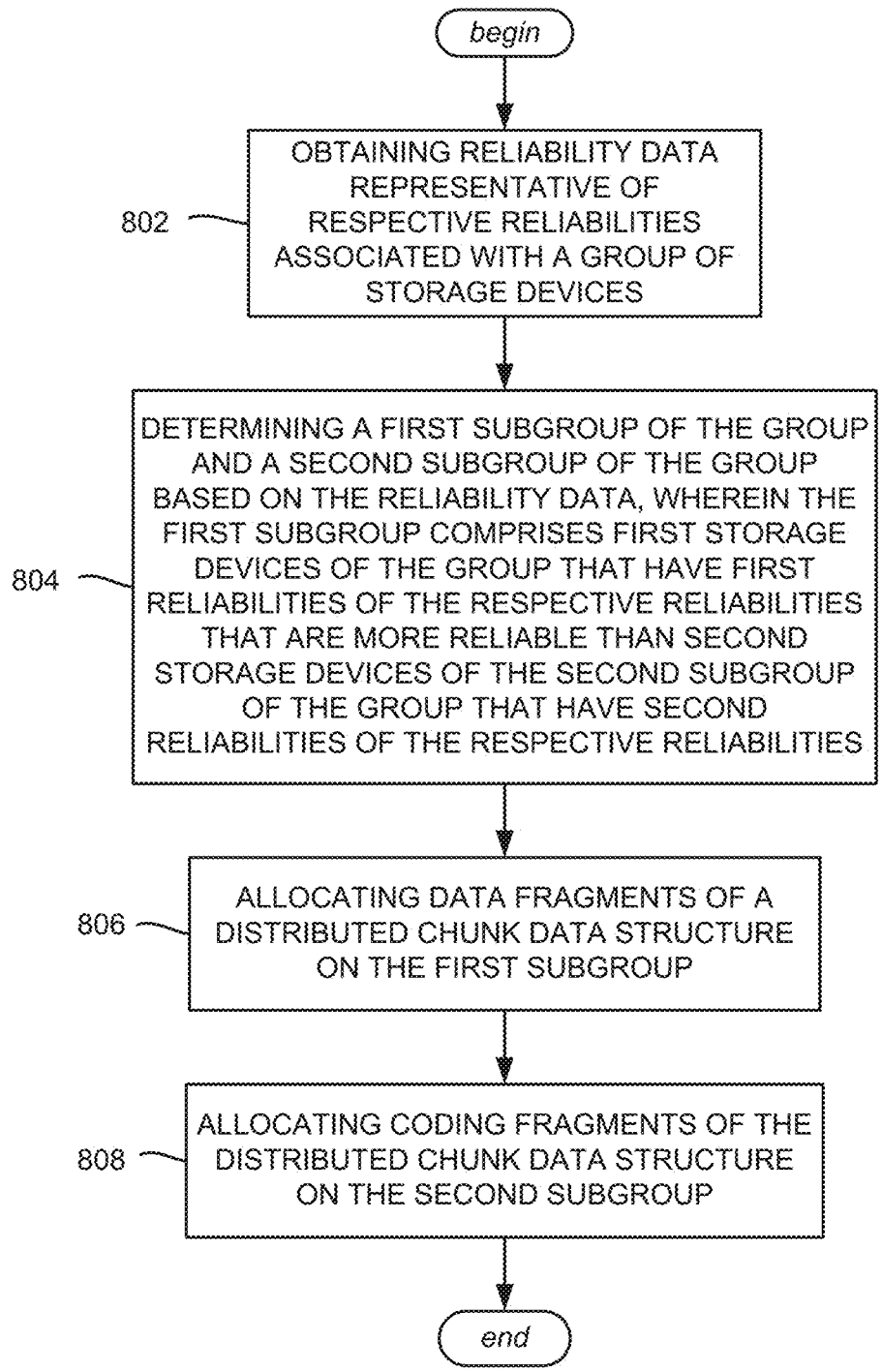
FIG. 8 is a flow diagram representation of example operations related to allocating erasure coded data fragments and coding fragments to subgroups of selected storage devices based on the predicted reliability of the storage devices, in accordance with various aspects and implementations of the subject disclosure.

One or more aspects, such as implemented in a machine-readable storage medium, comprising executable instructions that, when executed by a processor, facilitate performance of operations, can be directed towards operations exemplified in FIG. 8. Operation 802 represents obtaining reliability data representative of respective reliabilities associated with a group of storage devices. Operation 804 represents determining a first subgroup of the group and a second subgroup of the group based on the reliability data, wherein the first subgroup comprises first storage devices of the group that have first reliabilities of the respective reliabilities that are more reliable than second storage devices of the second subgroup of the group that have second reliabilities of the respective reliabilities. Operation 806 represents allocating data fragments of a distributed chunk data structure on the first subgroup. Operation 808 represents allocating coding fragments of the distributed chunk data structure on the second subgroup.

The group of storage devices can comprise solid state devices, and obtaining the reliability data can comprise determining respective data writes to respective solid state devices.

Further operations can comprise erasure coding data of a chunk data structure to encoded data fragments and encoded coding fragments, writing the encoded data fragments to the data fragments allocated on the first subgroup, and writing the encoded coding fragments to the coding fragments allocated on the second subgroup.

Determining the first subgroup and the second subgroup can comprise sorting the group of storage devices based on the reliability data.

As can be seen, described herein is a technology that facilitates improved data availability characteristics of storage systems that operate on immutable content. By using more reliable storage devices for data fragments relative to storage devices for coding fragments, data availability is statistically improved.

Figure 9:
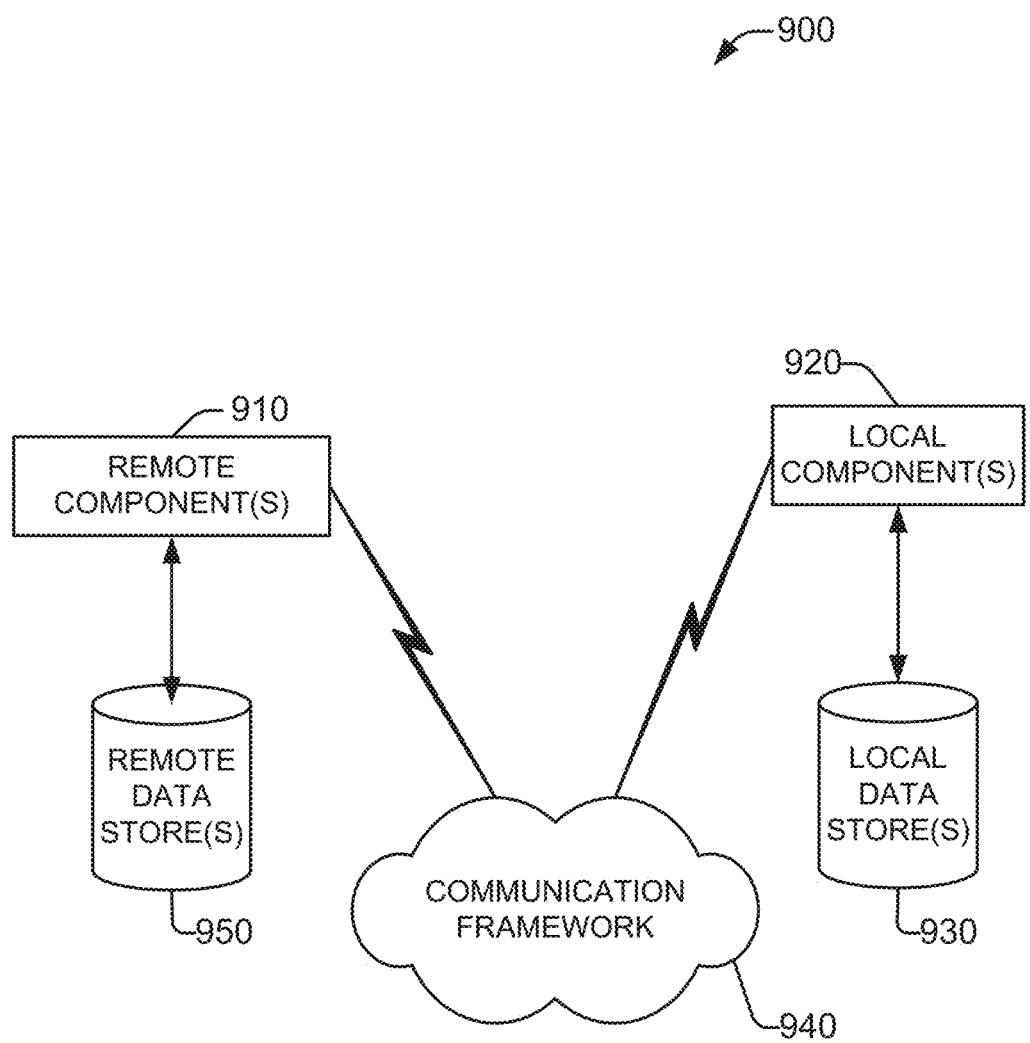
FIG. 9 depicts an example schematic block diagram of a computing environment with which the disclosed subject matter can interact, in accordance with various aspects and implementations of the subject disclosure.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a distributed computer system, connected to a local automatic scaling component and/or programs that use the resources of a distributed computer system, via communication framework 940. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise an automatic scaling component and/or programs that communicate/use the remote resources 910 and 920, etc., connected to a remotely located distributed computing system via communication framework 940.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940.

Figure 10:
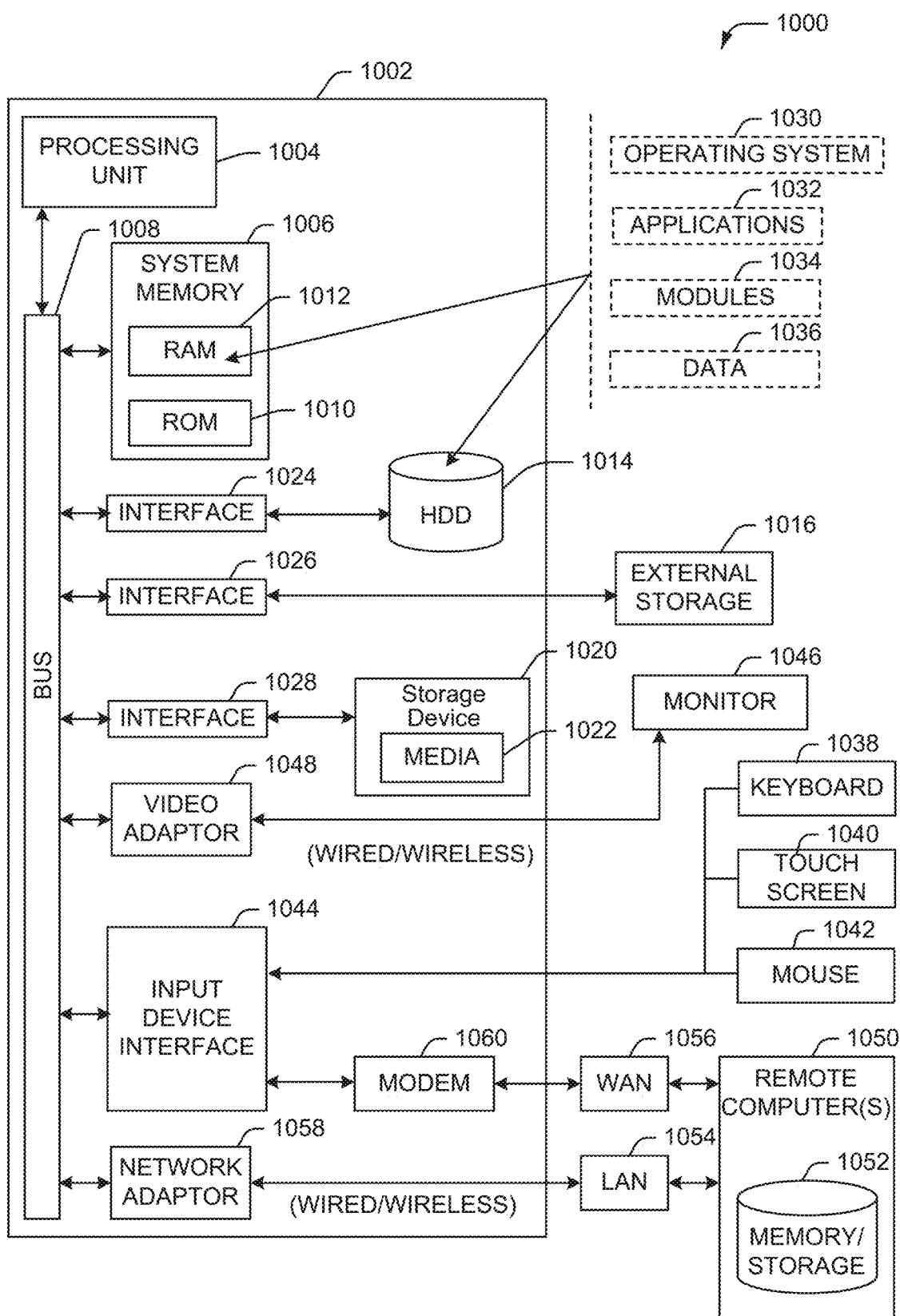
FIG. 10 illustrates an example block diagram of a computing system operable to execute the disclosed systems and methods in accordance with various aspects and implementations of the subject disclosure.

In order to provide additional context for various embodiments described herein, FIG. 10 and the following discussion are intended to provide a brief, general description of a suitable computing environment 1000 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014 (e.g., EIDE, SATA), and can include one or more external storage devices 1016 (e.g., a magnetic floppy disk drive (FDD) 1016, a memory stick or flash drive reader, a memory card reader, etc.). While the internal HDD 1014 is illustrated as located within the computer 1002, the internal HDD 1014 can also be configured for external use in a suitable chassis (not shown). Additionally, while not shown in environment 1000, a solid state drive (SSD) could be used in addition to, or in place of, an HDD 1014.

Other internal or external storage can include at least one other storage device 1020 with storage media 1022 (e.g., a solid state storage device, a nonvolatile memory device, and/or an optical disk drive that can read or write from removable media such as a CD-ROM disc, a DVD, a BD, etc.). The external storage 1016 can be facilitated by a network virtual machine. The HDD 1014, external storage device(s) 1016 and storage device (e.g., drive) 1020 can be connected to the system bus 1008 by an HDD interface 1024, an external storage interface 1026 and a drive interface 1028, respectively.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can be enable with a security module, such as a trusted processing module (TPM). For instance with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network (LAN) 1054 and/or larger networks, e.g., a wide area network (WAN) 1056. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point (AP) disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the Internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather is to be construed in breadth, spirit and scope in accordance with the appended claims.

What is claimed is:

1. A system, comprising:
a processor; and
a memory that stores executable instructions that, when executed by the processor, facilitate performance of operations, the operations comprising:
obtaining reliability data representative of reliabilities of storage devices;
dividing, based on the reliability data, the storage devices into a higher reliability first group of storage devices according to first reliabilities of the reliabilities of storage devices, a medium reliability second group of storage devices according to second reliabilities of the reliabilities of storage devices, and a lower reliability third group of storage devices according to third reliabilities of the reliabilities of storage devices;
storing, based on the reliability data, erasure coded data fragments to the higher reliability first group of storage devices with the first reliabilities of the reliabilities of storage devices that are more reliable than the medium reliability second group of storage devices with the second reliabilities of the reliabilities of storage devices, wherein the storing the erasure coded data fragments to the higher reliability first group of storage devices comprises storing the erasure coded data fragments to the higher reliability first group of storage devices and to a first part of the medium reliability second group of storage devices; and
storing, based on the reliability data, erasure coded coding fragments to the medium reliability second group of storage devices that are less reliable than the higher reliability first group of storage devices, wherein the storing the erasure coded coding fragments to the medium reliability second group of storage devices comprises storing the erasure coded data fragments to a second part of the medium reliability second group of storage devices and to the lower reliability third group of storage devices.

2. The system of claim 1, wherein the determining the reliability data comprises determining values representing respective numbers of data writes to the storage devices.

3. The system of claim 2, wherein the storage devices comprise solid state drives.

4. The system of claim 2, wherein the storage devices comprise a redundant array of solid state drives.

5. The system of claim 1, wherein the determining the reliability data comprises determining respective ages of the storage devices.

6. The system of claim 5, wherein the storage devices comprise hard disk drives.

7. The system of claim 1, wherein the operations further comprise, erasure coding a chunk data structure into the erasure coded data fragments and the erasure coded coding fragments.

8. The system of claim 1, wherein the operations further comprise, selecting the storage devices as a group of reliable storage devices, and sorting the group of reliable storage devices based on the reliability data.

9. The system of claim 1, wherein the operations further comprise, dividing the storage devices into subgroups based on the reliability data, and selecting one or more first subgroups of the subgroups that are more reliable for storing the erasure coded data fragments according to the first reliabilities of the reliabilities of storage devices, and selecting one or more second subgroups of the subgroups that are less reliable for storing the erasure coded coding fragments according to the second reliabilities of the reliabilities of storage devices.

10. The system of claim 1, wherein the operations further comprise pre-allocating a distributed chunk data structure on the storage devices, comprising allocating data fragment space of the distributed chunk data structure on the higher reliability first group of storage devices, and allocating coding fragment space of the distributed chunk data structure on the medium reliability second group of storage devices.

11. A method, comprising,
obtaining, by a system comprising a processor, reliability data for a group of storage devices;
erasure coding data corresponding to a chunk data structure into data fragments and coding fragments;
dividing, based on the reliability data, the storage devices of the group of storage devices into a higher reliability first subgroup of the group according to first reliabilities of reliabilities of the storage devices, a medium reliability second subgroup of the group according to second reliabilities of the reliabilities of the storage devices, and a lower reliability third subgroup of the group according to third reliabilities of the reliabilities of the storage devices;
storing the data fragments, based on the reliability data, to the first subgroup of the group comprising first storage devices of the group of storage devices that are more reliable than the second subgroup of the group comprising second storage devices of the group of storage devices, wherein the storing the data fragments to the higher reliability first subgroup comprises storing the data fragments to the higher reliability first subgroup and to a first part of the medium reliability second subgroup; and
storing the coding fragments, based on the reliability data, to the medium reliability second subgroup, wherein the storing the coding fragments to the medium reliability second subgroup comprises storing the data fragments to a second part of the medium reliability second subgroup and to the lower reliability third subgroup.

12. The method of claim 11, wherein the group of storage devices comprise solid state devices, and wherein the obtaining the reliability data for the group of storage devices comprises tracking respective data writes to respective solid state devices.

13. The method of claim 11, wherein the group of storage devices comprise disk drives, and wherein the obtaining the reliability data for the group of storage devices comprises obtaining respective ages of the disk drives.

14. The method of claim 11, further comprising sorting the group of storage devices based on the reliability data to determine the higher reliability first subgroup and the medium reliability second subgroup.

15. A non-transitory machine-readable medium, comprising executable instructions that, when executed by a processor of a data storage system, facilitate performance of operations, the operations comprising:

obtaining reliability data representative of respective reliabilities associated with a group of storage devices;

determining, based on the reliability data, a higher reliability first subgroup of the group according to first reliabilities of the respective reliabilities, a medium reliability second subgroup of the group according to second reliabilities of the respective reliabilities, and a lower reliability third subgroup of the group according to third reliabilities of the respective reliabilities;

allocating data fragments of a distributed chunk data structure on the higher reliability first subgroup, wherein the allocating the coding fragments of the distributed chunk to the higher reliability first subgroup comprises allocating the data fragments of the distributed chunk data structure to the higher reliability first subgroup and to a first part of the medium reliability second subgroup; and allocating coding fragments of the distributed chunk data structure on the medium reliability second subgroup, wherein the allocating the coding fragments of the distributed chunk data structure to the medium reliability second subgroup comprises allocating the data fragments of the distributed chunk data structure to a second part of the medium reliability second subgroup and to the lower reliability third subgroup.

16. The non-transitory machine-readable medium of claim 15, wherein the group of storage devices comprise solid state devices, and wherein the obtaining the reliability data comprises determining respective data writes to respective solid state devices.

17. The non-transitory machine-readable medium of claim 15, wherein the operations further comprise erasure coding data of a chunk data structure to encoded data fragments and encoded coding fragments, writing the encoded data fragments to the data fragments allocated on the higher reliability first subgroup, and writing the encoded coding fragments to the coding fragments allocated on the medium reliability second subgroup.

18. The non-transitory machine-readable medium of claim 15, wherein the determining the higher reliability first subgroup and the medium reliability second subgroup comprises sorting the group of storage devices based on the reliability data.

19. The non-transitory machine-readable medium of claim 15, wherein the obtaining the reliability data comprises obtaining an age of a disk drive of the group of storage devices.

20. The non-transitory machine-readable medium of claim 15, wherein the operations further comprise sorting the group of storage devices based on the reliability data to determine the higher reliability first subgroup and the medium reliability second subgroup.

* * * * *